US011462451B2

(12) United States Patent
Oh et al.

(10) Patent No.: US 11,462,451 B2
(45) Date of Patent: Oct. 4, 2022

(54) SEMICONDUCTOR DEVICE HAVING TERMINALS INCLUDING HEAT DISSIPATION PORTIONS, AND METHOD OF MANUFACTURING THEREOF

(71) Applicant: Mitsubishi Electric Corporation, Tokyo (JP)

(72) Inventors: Shohta Oh, Tokyo (JP); Toshitaka Sekine, Tokyo (JP); Hiroyuki Nakamura, Tokyo (JP); Kazuhiro Kawahara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 17/115,322

(22) Filed: Dec. 8, 2020

(65) Prior Publication Data

US 2021/0305110 A1    Sep. 30, 2021

(30) Foreign Application Priority Data

Mar. 27, 2020 (JP) .............................. JP2020-057299

(51) Int. Cl.
*H01L 23/31*   (2006.01)
*H01L 23/36*   (2006.01)
(Continued)

(52) U.S. Cl.
CPC .............. *H01L 23/31* (2013.01); *H01L 21/50* (2013.01); *H01L 23/36* (2013.01); *H01L 23/49541* (2013.01); *H01L 23/5384* (2013.01)

(58) Field of Classification Search
CPC ... H01L 23/31; H01L 23/36; H01L 23/49541; H01L 23/5384; H01L 21/50
(Continued)

(56) References Cited

U.S. PATENT DOCUMENTS 5,157,480 A * 10/1992 McShane ............... H05K 3/341
257/693
2017/0033710 A1 * 2/2017 Muto ..................... H02M 7/537

FOREIGN PATENT DOCUMENTS

JP    2006-80180 A    3/2006
JP    2009-259961 A   11/2009

OTHER PUBLICATIONS

An Office Action mailed by the German Patent Office dated Jun. 30, 2022, which corresponds to German Patent Application No. 10 2021 102 445.5 and is related to U.S. Appl. No. 17/115,322; with English language translation.

* cited by examiner

*Primary Examiner* — Quoc D Hoang
(74) *Attorney, Agent, or Firm* — Studebaker & Brackett PC

(57) ABSTRACT

An object is to provide a technique capable of improving heat dissipation while maintaining the workability of a product in a semiconductor device. A semiconductor device includes power chips, control chips configured to control the power chips, power side terminals, control side terminals, and a mold resin covering the power chips, the control chips, one ends side of the power side terminals, and one ends side of the control side terminals. An other ends side of the power side terminals and an other ends side of the control side terminals protrude horizontally from a side surface of the mold resin and bend downward at middle parts thereof. Of the power side terminals and the control side terminals, only on the other ends side of the power side terminals, heat dissipation portions protruding in a direction approaching or away from the mold resin from portions bent downward are formed.

6 Claims, 8 Drawing Sheets

(51) Int. Cl.
*H01L 21/50* (2006.01)
*H01L 23/495* (2006.01)
*H01L 23/538* (2006.01)

(58) Field of Classification Search
USPC ........................................................ 257/675
See application file for complete search history.

SEMICONDUCTOR DEVICE HAVING TERMINALS INCLUDING HEAT DISSIPATION PORTIONS, AND METHOD OF MANUFACTURING THEREOF

BACKGROUND OF THE INVENTION

Field of the Invention

The present disclosure relates to a semiconductor device and a manufacturing method of the semiconductor device.

Description of the Background Art

A semiconductor device includes a power chip arranged on a lead frame, a control chip that controls the power chip, a mold resin that covers the power chip and the control chip, and a terminal protruding from the mold resin and connected to a substrate on which the semiconductor device is mounted. There has been a problem in which the heat generated by the power chip propagates to the substrate through the terminal, causing the temperature rise in the substrate.

Typically, the cross section of the terminal has a rectangular shape, however, Japanese Patent Application Laid-Open No. 2006-80180, for example, discloses a structure in which convex portions are provided on both side edges of a lead for forming a mounted terminal exposed from a mold package. With such convex portions, the heat transferred from the mounted terminal to the mold package is dissipated, so that the thermal shock applied to the built-in electronic components in the mold package can be suppressed.

SUMMARY

However, in the technique described in Japanese Patent Application Laid-Open No. 2006-80180, the convex portions are provided on both the power side terminal connected to the power chip and the control side terminal connected to the control chip. The number of terminals, the terminal pitch, the terminal width, and the like on both sides differ which leads to a problem of worsening in workability, particularly in the control side terminal having a finer terminal width.

An object of the present disclosure is to provide a technique capable of improving heat dissipation while maintaining the workability of a product in a semiconductor device.

The semiconductor device according to the present disclosure includes power chips, control chips, power side terminals, control side terminals, and a mold resin. The control chip controls the power chip. The power side terminals are connected to the power chips. The control side terminals are connected to the control chips. The mold resin covers the power chips, the control chips, one ends side of the power side terminals, and one ends side of the control side terminals. An other ends side of the power side terminals and an other ends side of the control side terminals protrude horizontally from a side surface of the mold resin and bend downward at middle parts thereof. Of the power side terminals and the control side terminals, only on the other ends side of the power side terminals, heat dissipation portions protruding in a direction approaching or away from the mold resin from portions bent downward are formed.

Enhancement in heat dissipation property is ensured while maintaining the workability of the product in the semiconductor device.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
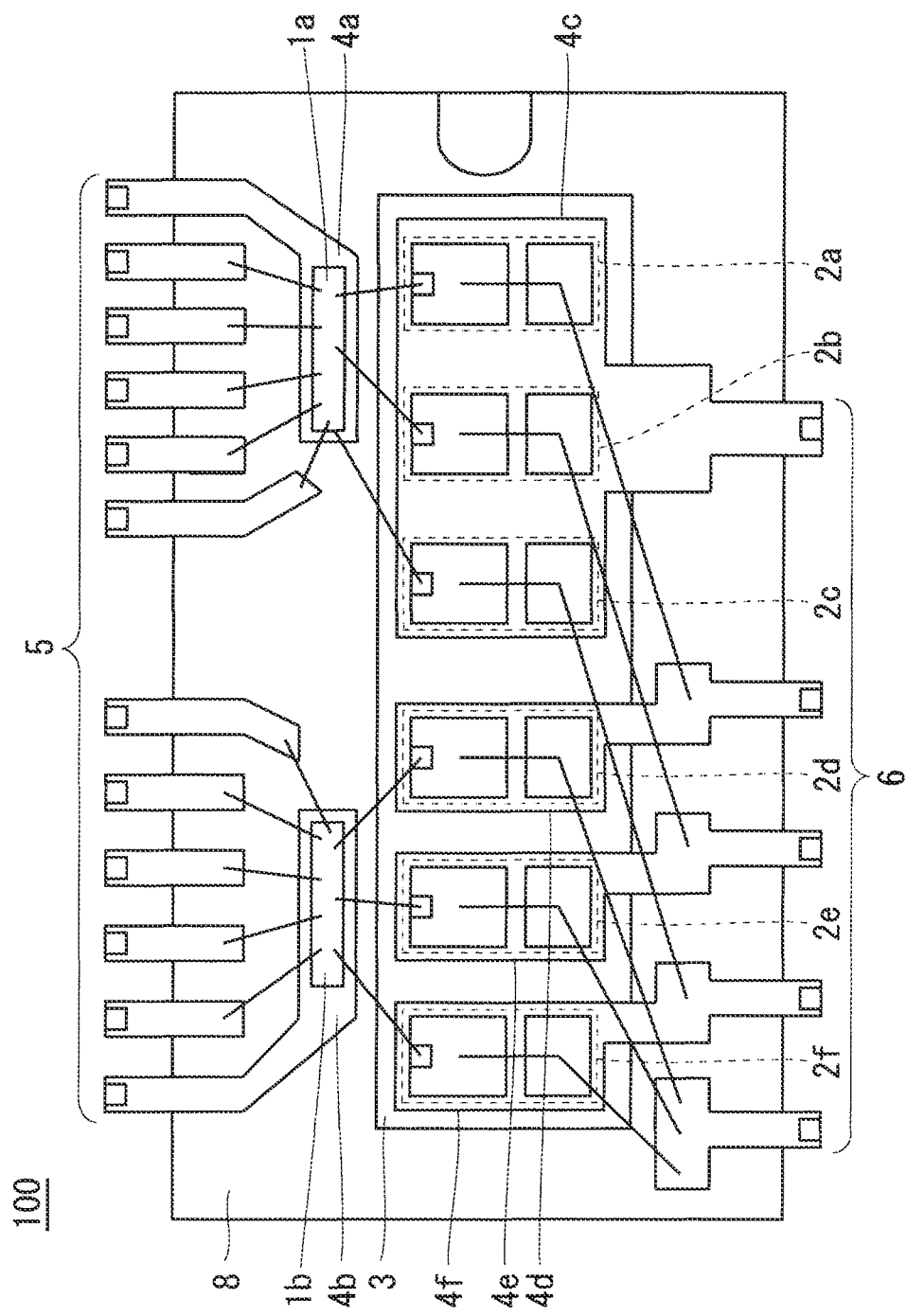
FIG. 1 is an internal configuration diagram of a semiconductor device according to Embodiment 1.
Figure 2:
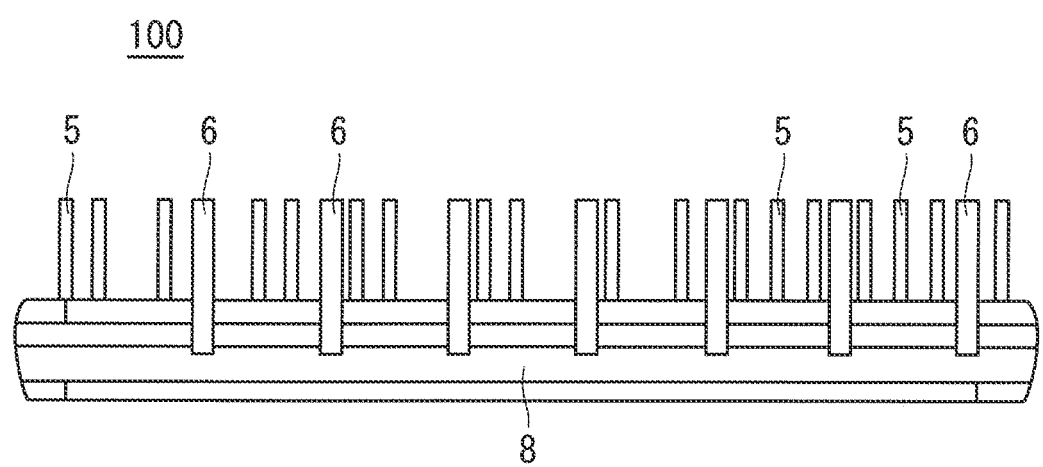
FIG. 2 is a side view illustrating a state in which the semiconductor device is turned upside down.
Figure 3:
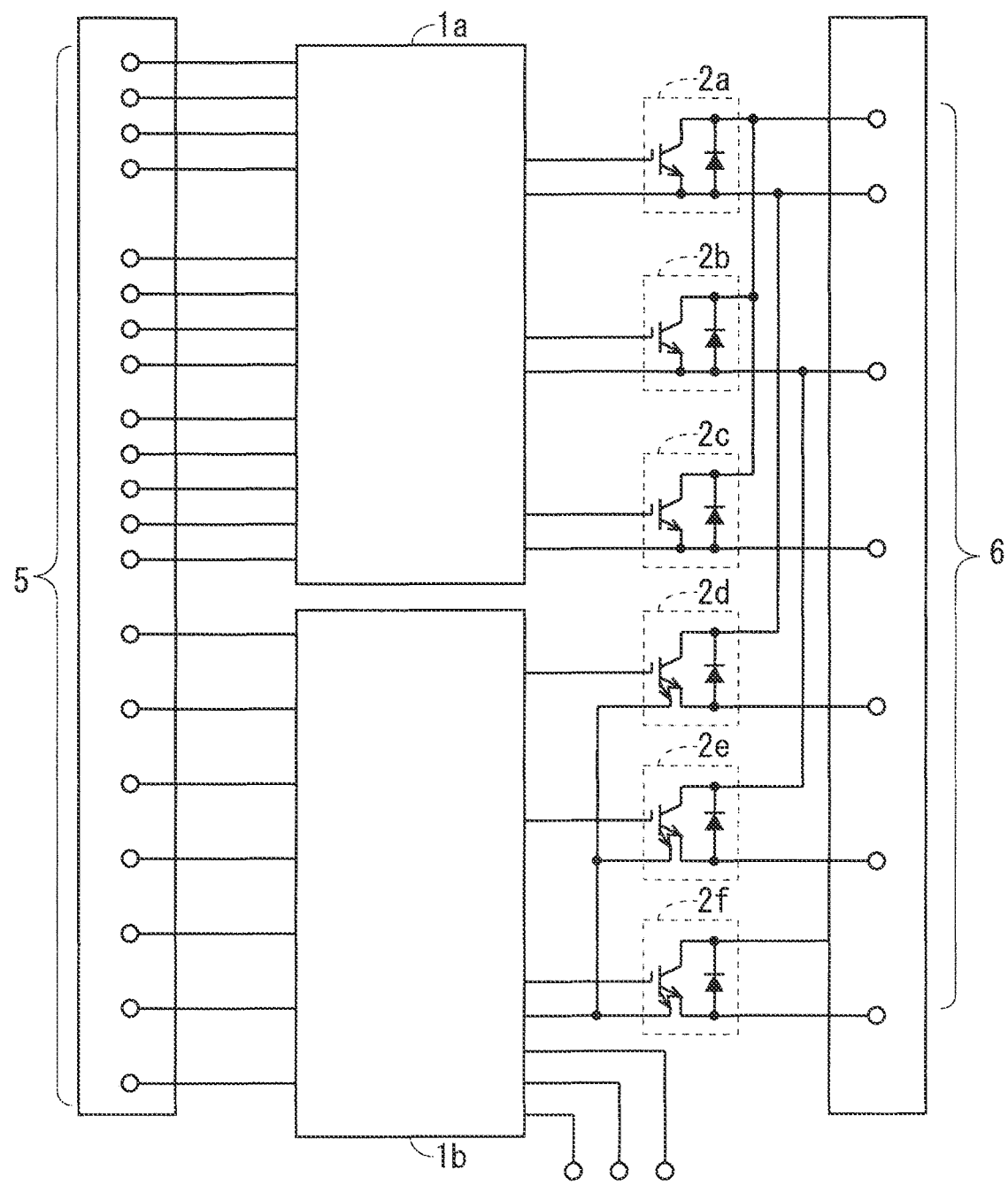
FIG. 3 is a circuit diagram of the semiconductor device.

Embodiment 1 will be described below with reference to the drawings. FIG. 1 is an internal configuration diagram of a semiconductor device 100 according to Embodiment 1. FIG. 2 is a side view illustrating a state in which the semiconductor device 100 is turned upside down. FIG. 3 is a circuit diagram of the semiconductor device 100.

As illustrated in FIG. 1, the semiconductor device 100 includes an insulating sheet 3, lead frames 4a to 4f, power chips 2a to 2f, control chips 1a and 1b, and a mold resin 8.

The insulating sheet 3 is a sheet in which metal foil or a metal plate and an insulating resin are adhered to each other, and is made of a material excellent in insulation and thermal conductivity. The lead frames 4c to 4f are arranged on the upper surface of the insulating sheet 3. The power chips 2a to 2c are mounted on the upper surface of the lead frame 4c. The power chips 2a to 2c are high-voltage power chips to which a high voltage is applied. The power chips 2d to 2f are mounted on the upper surfaces of the lead frames 4d to 4f, respectively. The power chips 2d to 2f are low-voltage power chips to which a voltage lower than the voltage applied to the high-voltage power chips is applied.

The lead frames 4a and 4b are arranged outside the insulating sheet 3. The control chips 1a and 1b are mounted on the upper surfaces of the lead frames 4a and 4b, respectively. The control chip 1a is a so-called High Voltage Integrated Circuit (HVIC) that controls the power chips 2a to 2c on the high voltage side. The control chip 1b is a so-called Low Voltage Integrated Circuit (LVIC) that controls the power chips 2d to 2f on the low voltage side.

As illustrated in FIGS. 1 and 3, each power chip 2a to 2f includes an Insulated Gate Bipolar Transistor (IGBT) and a Free Wheeling Diode (FWD). Wires are connected between the control chip 1a and the power chips 2a to 2c, between the control chip 1b and the power chips 2d to 2f, and between each IGBT and each FWD.

The lead frames 4a and 4b form a part of the control side terminals 5 each connected to the control chips 1a and 1b, and are connected to the rest of the control side terminals 5. The lead frames 4c to 4f form a part of the power side terminals 6 each connected to the power chips 2a to 2f, and are connected to the rest of the power side terminals 6. A power side terminal 6 has a plurality of phases of an output terminal, a positive electrode terminal, and a negative electrode terminal.

The mold resin 8 covers the power chips 2a to 2f, the control chips 1a and 1b, one ends side of the power side terminals 6, and one ends side of the control side terminals 5. Further, as illustrated in FIGS. 1 and 2, the other ends side of the power side terminals 6 and the other ends side of the control side terminals 5 are exposed from the mold resin 8. A semiconductor device in which the mold resin 8 also serves as the insulating sheet 3 is called a full-mold type, and the full-mold type semiconductor device includes no insulating sheet 3.

Figure 4:
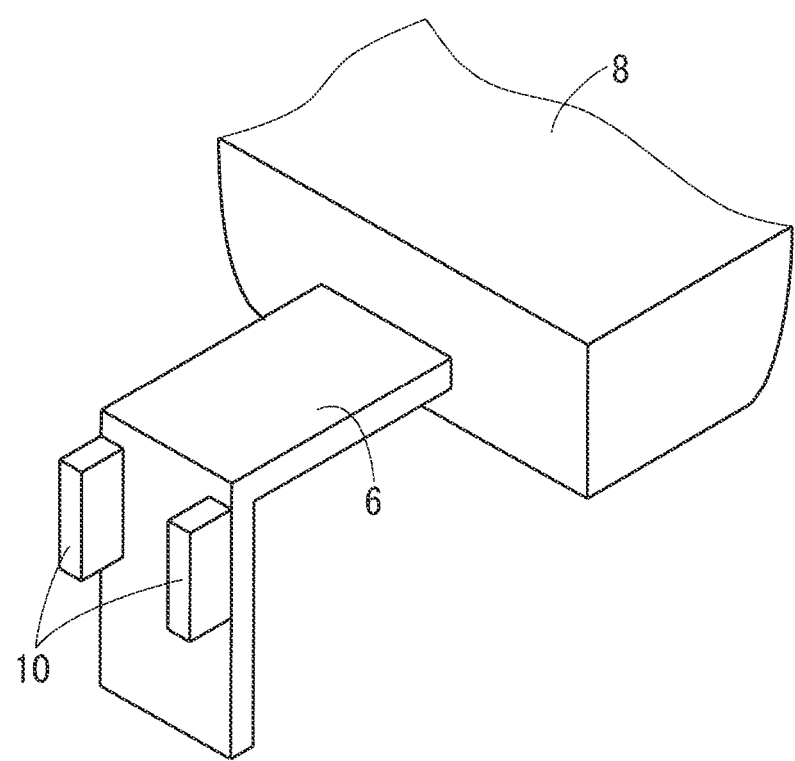
FIG. 4 is an enlarged perspective view of a power side terminal and surroundings thereof.

Next, the structure of a power side terminal 6, which is a feature of Embodiment 1, will be described with reference to FIG. 4. FIG. 4 is an enlarged perspective view of the power side terminal 6 and surroundings thereof.

As illustrated in FIG. 4, the other end side of the power side terminal 6 has a shape that protrudes horizontally from the side surface of the mold resin 8 and bends downward at the middle part. That is, the other end side of the power side terminal 6 is L-shaped in a front view. Although not illustrated, the other end side of the control side terminal 5 also has a shape that protrudes horizontally from the side surface of the mold resin 8 and bends downward at the middle part. That is, the other end side of the control side terminal 5 is L-shaped in a front view.

In order to improve the heat dissipation while maintaining the workability of the product, a pair of heat dissipation portions 10 is formed only on the other end side of the power side terminal 6 of the power side terminal 6 and the control side terminal 5. The pair of heat dissipation portions 10 is rectangular in front view, and is formed on the upper portion of the downwardly bent portion of the other end side of the power side terminal 6. Further, the pair of heat dissipation portions 10 protrudes from both ends in the width direction of the downwardly bent portion on the other end side of the power side terminal 6 in the width direction of the mold resin 8, that is, in the direction away from the mold resin 8.

The pair of heat dissipation portions 10 may protrude in a direction approaching the mold resin 8 instead of away from the mold resin 8. Further, the pair of heat dissipation portions 10 is formed on the other end side of the positive electrode terminal or on the other end side of the negative electrode terminal, which is particularly concerned about temperature rise when a device operated by three-phase AC power is connected to the semiconductor device 100 among the power side terminals 6.

Figure 5A:
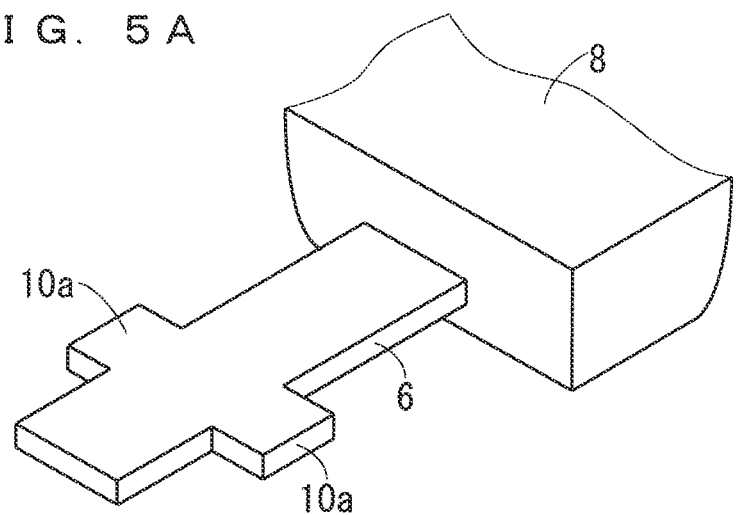
FIGS. 5A to 5C are enlarged perspective views of the power side terminal and surroundings thereof illustrating a method of manufacturing the power side terminal.
Figure 5B:
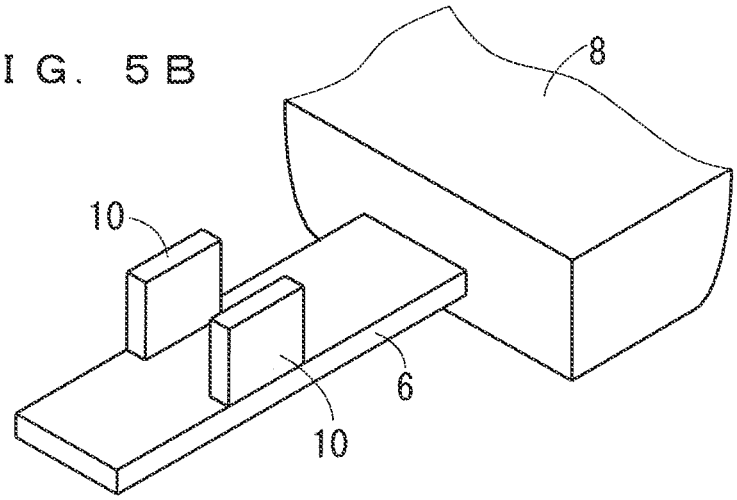
Figure 5C:
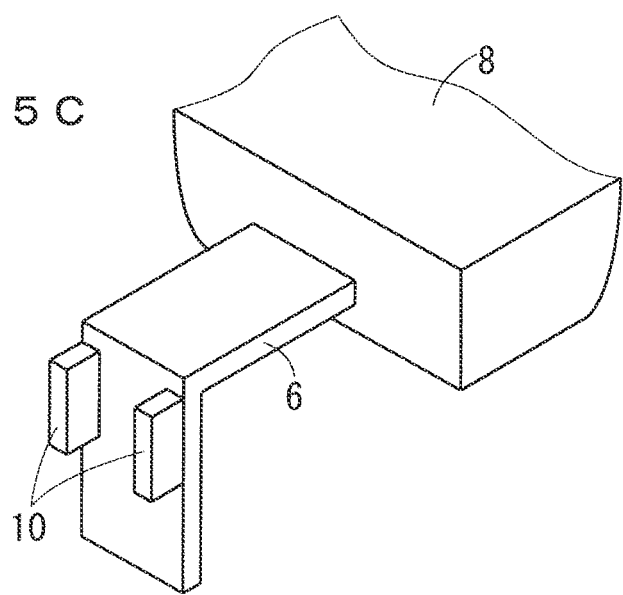

Next, a method of manufacturing the power side terminal 6 will be described with reference to FIGS. 5A to 5C. FIGS. 5A to 5C are enlarged perspective views of the power side terminal 6 and surroundings thereof illustrating a method of manufacturing the power side terminal 6.

As illustrated in FIG. 5A, the other end side of the power side terminal 6 is formed so as to have protruding portions 10a extending in the horizontal direction and protruding in the width direction from both ends in the width direction of the power side terminal 6. First, the mold resin 8 is formed so as to cover the power chips 2a to 2f, the control chips 1a and 1b one ends side of, the power side terminals 6, and one ends side of the control side terminals 5.

Next, as illustrated in FIG. 5B, after the mold resin 8 is formed, the heat dissipation portions 10 are formed by bending the protruding portions 10a of the power side terminal 6 upward or downward. Next, as illustrated in FIG. 5C, the other end side of the power side terminal 6 is bent downward at the middle part such that the other end side of the power side terminal 6 has an L-shape in front view.

Figure 6A:
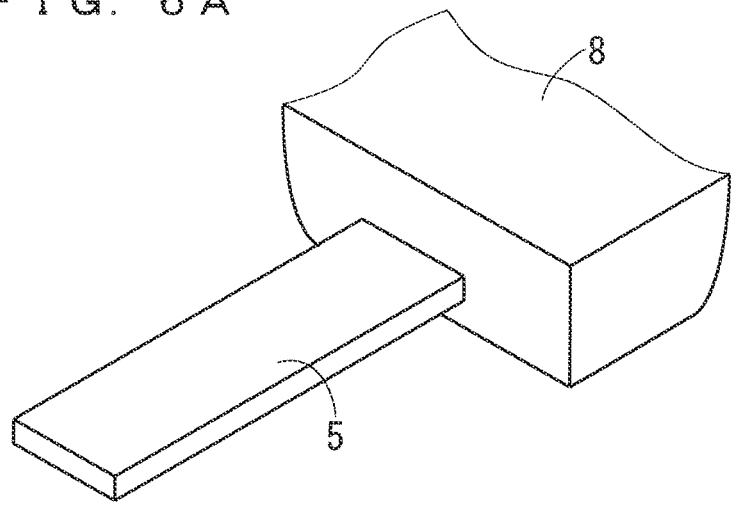
FIGS. 6A and 6B are enlarged perspective views of the control side terminal and surroundings thereof illustrating a method of manufacturing the control side terminal.
Figure 6B:
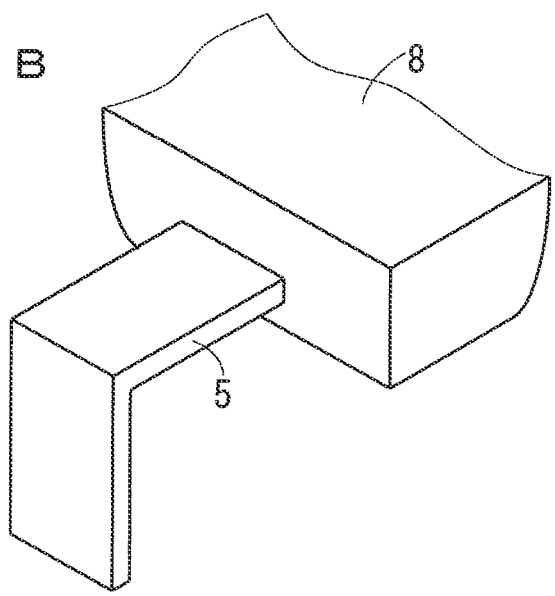

Next, a method of manufacturing the control side terminal 5 will be described with reference to FIGS. 6A and 6B. FIGS. 6A and 6B are enlarged perspective views of the control side terminal 5 and surroundings thereof illustrating a method of manufacturing the control side terminal 5.

The control side terminal 5 is manufactured in processes same as those of the power side terminal 6. That is, the process illustrated in FIG. 6A is performed in the process illustrated in FIG. 5A, and the process illustrated in FIG. 6B is performed in the process illustrated in FIG. 5C.

As described above, the semiconductor device 100 according to Embodiment 1 includes the power chips 2a to 2f, the control chips 1a and 1b that control the power chips 2a to 2f, the power side terminals 6 connected to the power chips 2a to 2f, the control side terminals 5 connected to the control chips 1a and 1b, and the mold resin 8 covering the power chips 2a to 2f, the control chips 1a and 1b, one ends side of the power side terminals 6, and one ends side of the control side terminals 5. Other ends side of the power side terminals 6 and the other ends side of the control side terminals 5 protrude horizontally from the side surface of the mold resin 8 and bend downward at the middle parts, and of the power side terminals 6 and the control side terminals 5, only on the other ends side of the power side terminals 6, the heat dissipation portions 10 protruding in a direction approaching or away from the mold resin 8 from portions bent downward are formed.

Further, the other end side of the power side terminal 6 has protruding portions 10a protruding in the width direction from both ends in the width direction of the power side terminal 6. The method of manufacturing the semiconductor device 100 includes a step (a) of forming the heat dissipation portions 10 by bending the protruding portions 10a of the power side terminal 6 after forming the mold resin 8, and a step (b) of bending the other end side of the power side terminal 6 at the middle part thereof.

The heat dissipation portions 10 are formed only on the other ends side of the power side terminals 6 of the power side terminals 6 and the control side terminals 5; therefore, the heat dissipation property of the semiconductor device 100 is improved. The heat dissipation portions 10 are not formed on the control side terminals 5 having a fine terminal width; therefore, maintenance of workability of the product is ensured in the semiconductor device 100.

The power side terminal 6 includes a positive electrode terminal and a negative electrode terminal, and the heat dissipation portions 10 are formed on the other end side of the positive electrode terminal or the other end side of the negative electrode terminal. In a case were a device operated by three-phase AC power is connected to the semiconductor device 100, the heat dissipation portions 10 are formed on the other end side of the positive electrode terminal or on the other end side of the negative electrode terminal on the other end; therefore, both maintenance of workability and improvement in the heat dissipation of the product are achievable in the semiconductor device 100.

Embodiment 2

Figure 7:
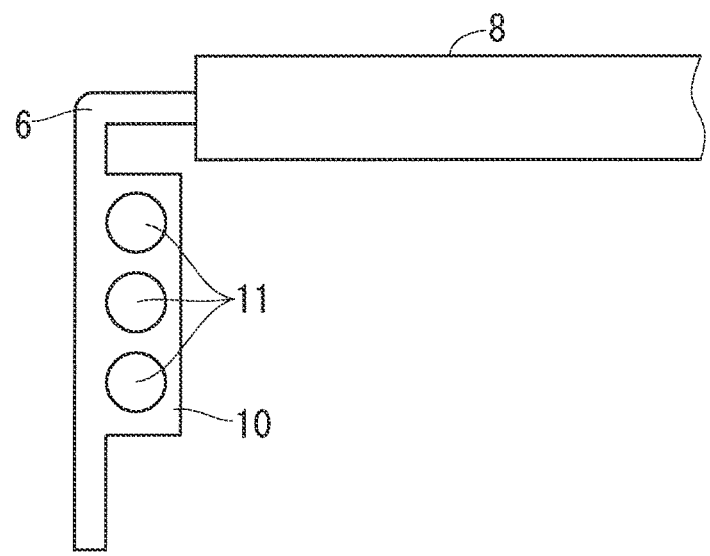
FIG. 7 is an enlarged front view of a power side terminal included in a semiconductor device according to Embodiment 2 and surroundings thereof.

Subsequently, a semiconductor device 100 according to Embodiment 2 will be described. FIG. 7 is an enlarged front view of a power side terminal 6 included in the semiconductor device 100 according to Embodiment 2 and surroundings thereof. In Embodiment 2, the same components as those described in Embodiment 1 are designated by the same reference numerals, and the description thereof will be omitted.

As illustrated in FIG. 7, in Embodiment 2, three through holes 11 are formed in each heat dissipation portion 10 in order to increase the surface area of a pair of heat dissipation portions 10. The three through holes 11 are formed in alignment in the vertical direction so as to extend each heat dissipation portion 10 in the thickness direction. The three through holes 11 are formed at the time of manufacturing the power side terminal 6.

In FIG. 7, although the pair of heat dissipation portions 10 protrudes in a direction approaching the mold resin 8, the pair of heat dissipation portions 10 may be formed in a direction away from the mold resin 8. Further, the number of through holes 11 is not limited to three and needs only be one or more.

As described above, the through holes 11 are formed in the semiconductor device 100 according to Embodiment 2. Accordingly, the surface area of the heat dissipation portion 10 increases; therefore, the heat dissipation property of the semiconductor device 100 is further improved.

Embodiment 3

Figure 8:
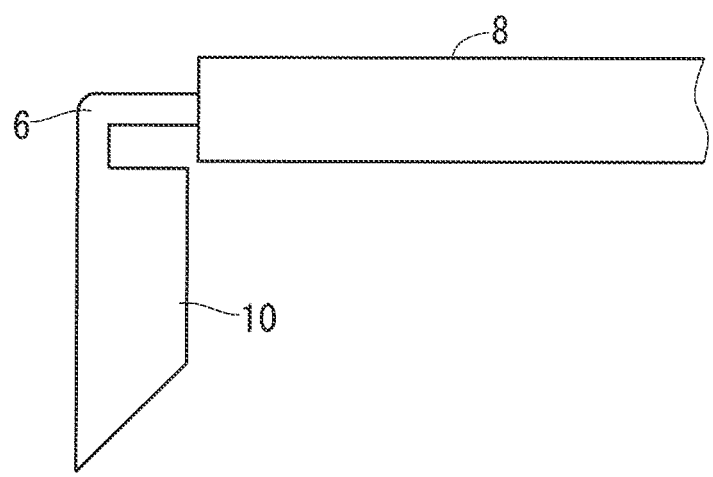
FIG. 8 is an enlarged front view of a power side terminal included in a semiconductor device according to Embodiment 3 and surroundings thereof.

Subsequently, a semiconductor device 100 according to Embodiment 3 will be described. FIG. 8 is an enlarged front view of a power side terminal included in the semiconductor device 100 according to Embodiment 3 and surroundings thereof. In Embodiment 3, the same components as those described in Embodiments 1 and 2 are designated by the same reference numerals, and the description thereof will be omitted.

As illustrated in FIG. 8, in Embodiment 3, each heat dissipation portion 10 is formed at the tip end portion on the other end side of the power side terminal 6. Specifically, each heat dissipation portion 10 is formed from the lower end of the downwardly bent portion to a portion excluding the upper end portion of the power side terminal 6. The tip end portion (lower end portion) of each heat dissipation portion 10 is formed in a tapered shape for improvement in insertability of the power side terminal 6 at the time of mounting the semiconductor device 100 onto the substrate. The tapered shape is formed at the time of manufacturing the power side terminal 6.

In FIG. 8, although the pair of heat dissipation portions 10 protrudes in a direction approaching the mold resin 8, the pair of heat dissipation portions 10 may be formed in a direction away from the mold resin 8.

As described above, in the semiconductor device 100 according to Embodiment 3, the heat dissipation portion 10 is formed at the tip end portion of the other end side of the power side terminal 6, and the tip end portion of the heat radiating portion 10 has a tapered shape. Consequently, the insertability of the power side terminal 6 at the time of mounting the semiconductor device 100 onto the substrate is improved.

Embodiments can be arbitrarily combined and can be appropriately modified or omitted.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
power chips;
control chips configured to control the power chips;
power side terminals connected to the power chips;
control side terminals connected to the control chips; and
a mold resin covering the power chips, the control chips, one ends side of the power side terminals, and one ends side of the control side terminals, wherein
an other ends side of the power side terminals and an other ends side of the control side terminals protrude horizontally from a side surface of the mold resin and bend downward at middle parts thereof, and
of the power side terminals and the control side terminals, only on the other ends side of the power side terminals, heat dissipation portions protruding in a direction approaching or away from the mold resin from portions bent downward are formed.

2. The semiconductor device according to claim 1, wherein
the power side terminals include a positive electrode terminal and a negative electrode terminal, and
the heat dissipation portions are formed on an other end side of the positive electrode terminal or an other end side of the negative electrode terminal.

3. The semiconductor device according to claim 2, wherein
the heat dissipation portions are formed on only one of the other end side of the positive electrode terminal and the other end side of the negative electrode terminal.

4. The semiconductor device according to claim 1, wherein
a through hole is formed on the heat dissipation portions.

5. The semiconductor device according to claim 1, wherein
the heat dissipation portions are formed at tip end portions of the other ends side of the power side terminals, and
tip end portions of the heat dissipation portions are formed in a tapered shape.

6. A manufacturing method of a semiconductor device manufacturing the semiconductor device according to claim 1, wherein
the other ends side of the power side terminals have protruding portions protruding in a width direction from both ends in a width direction of the power side terminals, the method comprising:
(a) forming the heat dissipation portions by bending the protruding portions of the power side terminals after the mold resin is formed; and
(b) bending the other ends side of the power side terminals at middle parts thereof.

* * * * *